United States Patent
Kim et al.

(10) Patent No.: US 9,261,737 B2
(45) Date of Patent: Feb. 16, 2016

(54) LIQUID CRYSTAL DISPLAY

(71) Applicant: Samsung Display Co., Ltd., Yongin (KR)

(72) Inventors: Tae Ho Kim, Asan-si (KR); Mi Suk Kim, Cheonan-si (KR); So Youn Park, Hwaseong-si (KR); Daisuke Inoue, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/334,242

(22) Filed: Jul. 17, 2014

(65) Prior Publication Data
US 2015/0205169 A1 Jul. 23, 2015

(30) Foreign Application Priority Data
Jan. 17, 2014 (KR) ........................ 10-2014-0006313

(51) Int. Cl.
| | |
|---|---|
| *G02F 1/1343* | (2006.01) |
| *G02F 1/1368* | (2006.01) |
| *G02F 1/1333* | (2006.01) |
| *G02F 1/1337* | (2006.01) |
| *C09K 19/56* | (2006.01) |
| *C09K 19/30* | (2006.01) |
| *C09K 19/12* | (2006.01) |
| *H01L 27/12* | (2006.01) |

(52) U.S. Cl.
CPC .......... *G02F 1/134309* (2013.01); *C09K 19/12* (2013.01); *C09K 19/3003* (2013.01); *C09K 19/3066* (2013.01); *C09K 19/3098* (2013.01); *C09K 19/56* (2013.01); *G02F 1/1368* (2013.01); *G02F 1/133345* (2013.01); *G02F 1/133788* (2013.01); *H01L 27/1225* (2013.01); *C09K 2019/122* (2013.01); *C09K 2019/301* (2013.01); *C09K 2019/3004* (2013.01)

(58) Field of Classification Search
CPC ........... G02F 1/134309; G02F 1/1368; G02F 1/133788; G02F 1/133345; C09K 19/3003; C09K 19/12; C09K 19/3066; C09K 19/3402; C09K 19/3098; C09K 19/56; C09K 2019/3422; C09K 2019/301; C09K 2019/3004; H01L 2924/0002; H01L 2924/00; H01L 27/1225; H01L 27/124; H01L 27/1248
See application file for complete search history.

(56) References Cited

U.S. PATENT DOCUMENTS

| | | | |
|---|---|---|---|
| 6,063,829 A | 5/2000 | Endou et al. | |
| 7,524,541 B2 * | 4/2009 | Tsutsui et al. | 428/1.26 |

(Continued)

FOREIGN PATENT DOCUMENTS

| | | |
|---|---|---|
| JP | 2005-049835 | 2/2005 |
| KR | 1020120079810 | 7/2012 |

(Continued)

*Primary Examiner* — Nikolay Yushin
(74) *Attorney, Agent, or Firm* — H.C. Park & Associates, PLC

(57) ABSTRACT

A liquid crystal display including: a first substrate; a second substrate facing the first substrate; a liquid crystal layer including a liquid crystal disposed between the first substrate and the second substrate; a thin film transistor disposed on the first substrate; a first electrode connected to the thin film transistor; a second electrode overlapping the first electrode with an insulating layer interposed therebetween; and a first alignment layer disposed on the first electrode. The first alignment layer includes a photo-alignment layer, and the liquid crystal has negative dielectric anisotropy.

16 Claims, 9 Drawing Sheets

(56) References Cited

U.S. PATENT DOCUMENTS

| | | | |
|---|---|---|---|
| 7,585,551 B2* | 9/2009 | Tsai et al. | 428/1.26 |
| 7,812,917 B2* | 10/2010 | Kawabe et al. | 349/155 |
| 8,057,700 B2* | 11/2011 | Oh et al. | 252/299.4 |
| 8,149,357 B2* | 4/2012 | Choi et al. | 349/104 |
| 8,610,855 B2* | 12/2013 | Imanishi et al. | 349/135 |
| 2006/0051525 A1* | 3/2006 | Tsutsui et al. | 428/1.26 |
| 2008/0020149 A1* | 1/2008 | Tsai et al. | 428/1.26 |
| 2008/0204645 A1* | 8/2008 | Kawabe et al. | 349/123 |
| 2009/0146105 A1* | 6/2009 | Oh et al. | 252/299.61 |
| 2010/0033657 A1* | 2/2010 | Choi et al. | 349/104 |
| 2011/0222006 A1* | 9/2011 | Imanishi et al. | 349/124 |
| 2012/0300157 A1* | 11/2012 | Kim et al. | 349/106 |
| 2013/0146213 A1 | 6/2013 | Park | |
| 2014/0104553 A1* | 4/2014 | Imanishi et al. | 349/123 |
| 2014/0368779 A1* | 12/2014 | Park et al. | 349/124 |

FOREIGN PATENT DOCUMENTS

| | | |
|---|---|---|
| KR | 1020120138023 | 12/2012 |
| WO | 2012053525 | 4/2012 |

* cited by examiner

FIG. 7

| Negative PLS | Linear afterimage generation sheet number / estimation sheet number | | |
|---|---|---|---|
| | 2.5hr | 6hr | 29hr |
| Comparative example | 2 / 5 | 5 / 5 | 5 / 5 |
| Exemplary embodiment | 0 / 5 | 0 / 5 | 3 / 5 |

Strong linear afterimage

Weak linear afterimage

LIQUID CRYSTAL DISPLAY

CROSS-REFERENCE TO RELATED APPLICATION

This application claims priority to and the benefit of Korean Patent Application No. 10-2014-0006313, filed on Jan. 17, 2014, which is hereby incorporated by reference for all purposes as if fully set forth herein.

BACKGROUND

1. Field

Exemplary embodiments of the present invention relates to a liquid crystal display.

2. Discussion of the Background

A liquid crystal display (LCD) is one of the most widely used flat panel displays (FPD), and it is composed of two display panels on which field generating electrodes such as pixel electrodes and a common electrode are formed, and a liquid crystal layer interposed between the two display panels. A voltage is applied to the field generating electrodes to generate an electric field in the liquid crystal layer, and the orientation of liquid crystal molecules of the liquid crystal layer is determined and the polarization of incident light is controlled, through the generated electric field, to display an image.

To increase a display quality of the liquid crystal display, a high contrast ratio, a wide viewing angle, and a fast response speed may be utilized. In addition, a liquid crystal display should be configured to prevent stains due to the scattering of liquid crystal molecules by external pressure.

Types of liquid crystals include those having positive dielectric anisotropy and those having negative dielectric anisotropy. The liquid crystals having negative dielectric anisotropy have a small splay angle with the surrounding liquid crystals, as compared with those having positive dielectric anisotropy. As such, such liquid crystals have a high rotation elastic energy, and thereby transmittance is relatively high. However, the liquid crystals having negative dielectric anisotropy include more ion impurities, as compared with those having positive dielectric anisotropy, such that there can be serious afterimage problems.

The above information disclosed in this Background section is only for enhancement of understanding of the background of the invention and therefore it may contain information that does not form the prior art that is already known in this country to a person of ordinary skill in the art.

SUMMARY

Exemplary embodiments of the present invention provide a liquid crystal display with an improved afterimage.

Additional features of the invention will be set forth in the description which follows, and in part will be apparent from the description, or may be learned by practice of the invention.

A liquid crystal display according to an exemplary embodiment of the present invention includes: a first substrate; a second substrate facing the first substrate; a liquid crystal layer disposed between the first substrate and the second substrate; a thin film transistor disposed on the first substrate; a first electrode connected to the thin film transistor; a second electrode overlapping the first electrode with an insulating layer interposed therebetween; and a first alignment layer disposed on the first electrode. The first alignment layer includes a photo-alignment layer, and the liquid crystal molecules of the liquid crystal layer have a negative dielectric anisotropy.

According to an exemplary embodiment of the present invention, by forming the photo-alignment layer without a rubbing process and by using the liquid crystal having the negative dielectric anisotropy that may be effectively activated through the combination with the photo-alignment layer, the afterimages of the liquid crystal display may be reduced.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

FIG. 5 to FIG. 7 are graphs comparing an afterimage level of a liquid crystal display according to an exemplary embodiment of the present invention with an afterimage level of a liquid crystal display according to a comparative example.

DETAILED DESCRIPTION OF THE EXEMPLARY EMBODIMENTS

Figure 1:
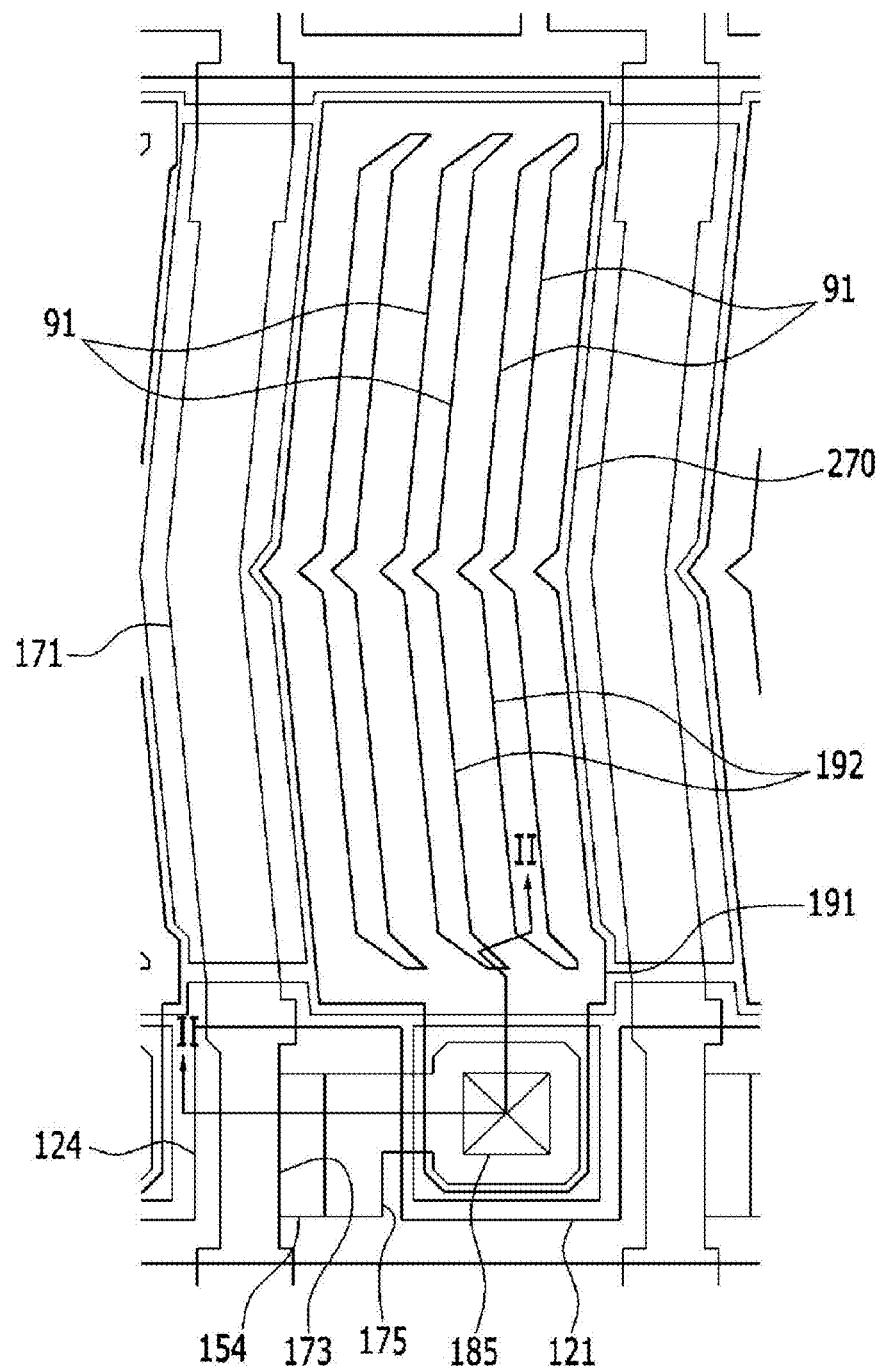
FIG. 1 is a top plan view of a liquid crystal display according to an exemplary embodiment of the present invention.

Hereinafter, exemplary embodiments of the present invention will be described in detail with reference to the accompanying drawings. As those skilled in the art would realize, the described embodiments may be modified in various different ways, all without departing from the spirit or scope of the present invention. On the contrary, exemplary embodiments introduced herein are provided to make disclosed contents thorough and complete and to sufficiently transfer the spirit of the present invention to those skilled in the art. In the drawings, the thickness of layers, films, panels, regions, etc., are exaggerated for clarity.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Figure 2:
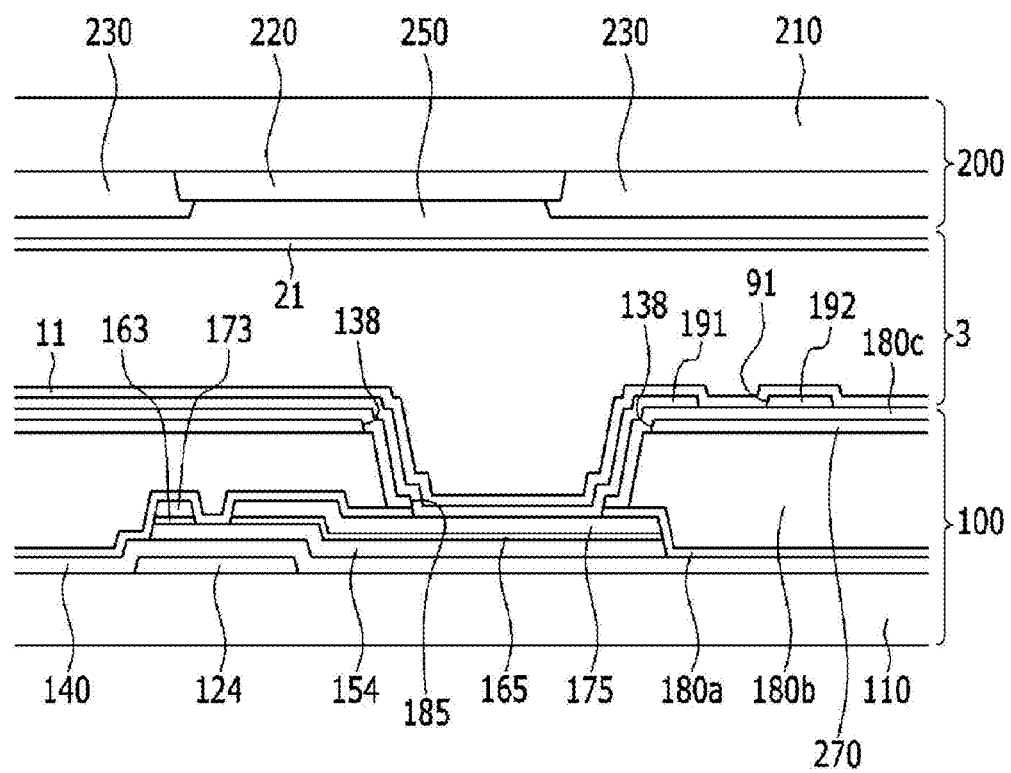
FIG. 2 is a cross-sectional view taken along a line II-II of FIG. 1.

FIG. 1 is a top plan view of a liquid crystal display according to an exemplary embodiment of the present invention. FIG. 2 is a cross-sectional view taken along a line II-II of FIG. 1. Referring to FIG. 1 and FIG. 2, the liquid crystal display includes a lower panel 100, an opposing upper panel 200, and a liquid crystal layer 3 interposed therebetween.

Firstly, the lower panel 100 will be described. A gate conductor including a gate line 121 is formed on a first substrate 110 made of a transparent glass or plastic. The gate line 121 includes a gate electrode 124 and an end portion (not shown) for connection with another layer or an external driving circuit. The gate line 121 may be made aluminum (Al) or an aluminum alloy, silver (Ag) or a silver alloy, copper (Cu) or a copper alloy, molybdenum (Mo) or a molybdenum alloy, chromium (Cr), tantalum (Ta), or titanium (Ti). The gate line 121, however, may have a multilayer structure including at least two conductive layers having different physical properties.

A gate insulating layer 140 made of a silicon nitride ($SiN_x$) or a silicon oxide ($SiO_x$) is formed on the gate line 121. The gate insulating layer 140 may have a multilayer structure including at least two insulating layers having different physical properties.

A semiconductor layer 154 made of amorphous silicon or polysilicon is disposed on the gate insulating layer 140. The semiconductor layer 154 may include an oxide semiconductor.

Ohmic contacts 163 and 165 are formed on the semiconductor layer 154. The ohmic contacts 163 and 165 may be made of a material such as n+ hydrogenated amorphous silicon in which an n-type impurity such as phosphorus is doped at a high concentration, or a silicide. The ohmic contacts 163 and 165 may be disposed as a pair on the semiconductor layer 154. When the semiconductor layer 154 is an oxide semiconductor, the ohmic contacts 163 and 165 may be omitted.

A data conductor including a data line 171 including a source electrode 173 and a drain electrode 175 is formed on the ohmic contacts 163 and 165 and the gate insulating layer 140. The data line 171 includes a wide end portion (not illustrated) for connection with another layer or an external driving circuit. The data line 171 transfers a data signal and extends mainly in a vertical direction across the gate line 121. The data line 171 may be V-shaped, to obtain a high transmittance of the liquid crystal display.

The source electrode 173 extends from the data line 171 and is disposed on the same line as the data line 171. The drain electrode 175 is formed to extend in parallel with the source electrode 173. Therefore, the drain electrode 175 is parallel to a part of the data line 171.

The gate electrode 124, the source electrode 173, and the drain electrode 175 form a thin film transistor (TFT), together with the semiconductor 154. A channel of the thin film transistor is formed on the semiconductor 154 between the source electrode 173 and the drain electrode 175.

The liquid crystal display includes the source electrode 173 disposed on the same line as the data line 171 and the drain electrode 175 extending in parallel with the data line 171, so that the width of the thin film transistor may be increased, without increasing an area of the data conductor. As such, an aperture ratio of the liquid crystal display may be increased.

The data line 171 and the drain electrode 175 may be made of a refractory metal such as molybdenum, chromium, tantalum, and titanium, or an alloy thereof, and may have a multilayer structure including a refractory metal layer (not illustrated) and a low resistance conductive layer (not illustrated). Examples of the multilayer structure include a double layer including a chromium or molybdenum (alloy) lower layer and an aluminum (alloy) upper layer, and a triple layer including a molybdenum (alloy) lower layer, an aluminum (alloy) intermediate layer, and a molybdenum (alloy) upper layer.

A first passivation layer 180a is formed on the data conductors 171, 173, and 175, the gate insulating layer 140, and the exposed portion of the semiconductor 154. The first passivation layer 180a may be made of an organic insulating material or an inorganic insulating material.

A second passivation layer 180b is formed on the first passivation layer 180a. The second passivation layer 180b may be made of an organic insulator.

The second passivation layer 180b may be a color filter. When the second passivation layer 180b is the color filter, the second passivation layer 180b may inherently display one of primary colors, and examples of the primary colors may include three primary colors such as red, green, and blue, or yellow, cyan, and magenta. Even though not illustrated, the color filter may further include a color filter displaying a mixed color of the primary colors or white color other than the primary colors. When the second passivation layer 180b is the color filter, a color filter 230 may be omitted in the upper panel 200 that will be described later. In the alternative, the second passivation layer 180b may be formed of the organic insulating material, and the color filter (not shown) may be formed between the first passivation layer 180a and the second passivation layer 180b.

A common electrode 270 is disposed on the second passivation layer 180b. The common electrode 270 has a planar shape, may be formed on the entire first substrate 110 as a plate. The common electrode 270 may have an opening 138 exposing the drain electrode 175.

Common electrodes 270 disposed on adjacent pixels are connected to each other to receive a common voltage supplied from outside of the display area.

An insulating layer 180c is formed on the common electrode 270. The insulating layer 180c may be formed of the organic insulating material or the inorganic insulating material.

A pixel electrode 191 is disposed on the insulating layer 180c. The pixel electrode 191 is curved to be parallel with the data line 171. The pixel electrode 191 includes a plurality of cutouts 91, and a plurality of branch electrodes 192 disposed between adjacent cutouts 91.

The pixel electrode 191 is referred to as a first field generating electrode or a first electrode, and the common electrode 270 referred to as is a second field generating electrode or a second electrode. The pixel electrode 191 and the common electrode 270 may form a horizontal electric field.

The first passivation layer 180a, the second passivation layer 180b, and the insulating layer 180c have a first contact hole 185 exposing the drain electrode 175. The pixel electrode 191 is physically and electrically connected to the drain electrode 175 through the first contact hole 185, to receive a voltage from the drain electrode 175.

A first alignment layer 11 is formed on the pixel electrode 191 and the insulating layer 180c. The first alignment layer 11 includes a photo-alignment layer.

In the present exemplary embodiment, the first alignment layer 11 is formed by polymerizing at least one of cyclobutane dianhydride (CBDA) and cyclobutane dianhydride (CBDA) derivatives. For example, the first alignment layer 11 may be formed by polymerizing at least one of cyclobutane dianhydride (CBDA) represented by Formula (A) and cyclobutane dianhydride (CBDA) derivatives represented by Formula (B), and a diamine.

Formula (A)

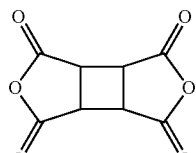

Formula (B)

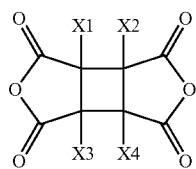

In Formula (B), X1, X2, X3, and X4 are independently selected from hydrogen, fluorine, or an organic compound, and at least one among X1, X2, X3, and X4 is not hydrogen.

In the present exemplary embodiment, the diamine may be an aromatic diamine such as p-phenylenediamine, m-phenylenediamine, 2,5-diaminotoluene, 2,6-diaminotoluene, 4,4'-diaminobiphenyl, 3,3'-dimethyl-4,4'-diaminobiphenyl, 3,3'-dimethoxy-4,4'-diaminobiphenyl, diaminodiphenylmethane, diaminodiphenylether, 2,2'-diaminodiphenylpropane, bis(3,5-diethyl4-aminophenyl)methane, diaminodiphenyl sulfone, diaminobenzophenone, diaminonaphthalene, 1,4-bis(4-aminophenoxy)benzene, 1,4-bis(4-aminophenyl)benzene, 9,10-bis(4-aminophenyl)anthracene, 1,3-bis(4-aminophenoxy)benzene, 4,4'-bis(4-aminophenoxy)diphenylsulfone, 2,2-bis[4-(4-aminophenoxyl)phenyl]propane, 2,2-bis(4-aminophenyl)hexafluoropropane, 2,2-bis[4-(4-aminophenoxyl)phenyl]hexafluoropropane, an alicyclic diamine such as bis(4-aminocyclohexyl)methane and bis(4-amino-3-methylcyclohexyl)methane, and an aliphatic diamine such as tetramethylenediamine and hexamethylenediamine, however it is not limited thereto.

In the present exemplary embodiment, the first alignment layer 11 may include a repeating unit represented by Formula (C), Formula (D), or Formula (E).

Formula (C)

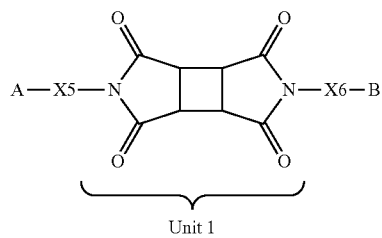

Formula (D)

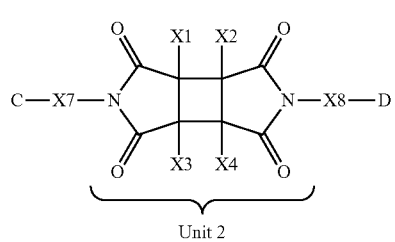

Formula (E)

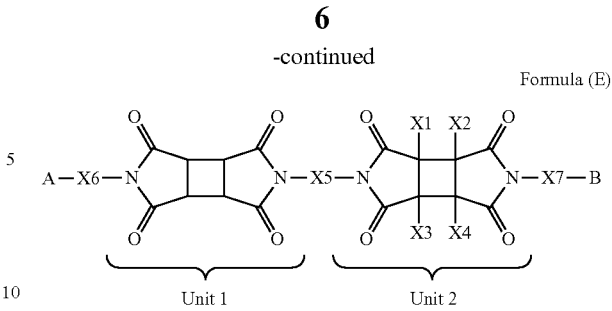

In Formula (C), Formula (D), and Formula (E), X5, X6, X7, and X8 may respectively be a compound coupled to two amino groups (—NH2) of adjacent diamine. A, B, C, D, E, and F may be unit 1 or unit 2. In Formula (D) and Formula (E), X1, X2, X3, and X4 may be independently selected from hydrogen, fluorine, or an organic compound, and at least one among X1, X2, X3, and X4 may not be hydrogen.

The diamine may be one among compounds represented by Formula (F), Formula (G), and Formula (H), however it is not limited thereto. In Formula (G), X may be an alkyl group, and in Formula (H), X may be an alkylene group, —S—, —CO—, or —NH—.

Formula (F)

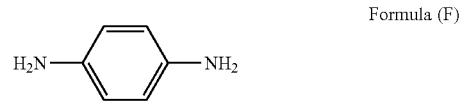

Formula (G)

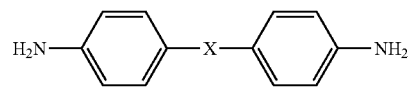

Formula (H)

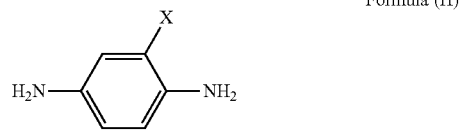

A method of forming the alignment layer will now be described. A photoalignment agent, formed by polymerizing at least one of the CBDA and the CBDA derivatives and the diamine, is coated on the pixel electrode 191. Next, the coated photoalignment agent is baked. The baking may be performed through two steps of a pre-bake and a hard bake.

Next, polarized light is radiated onto the photoalignment agent to form the first alignment layer 11. At this time, the irradiated light may be ultraviolet rays in a range 240 nanometers to 380 nanometers. For example, ultraviolet rays of 254 nanometers may be used. To increase the alignment characteristic, the first alignment layer 11 may be baked one more time.

Figure 3:
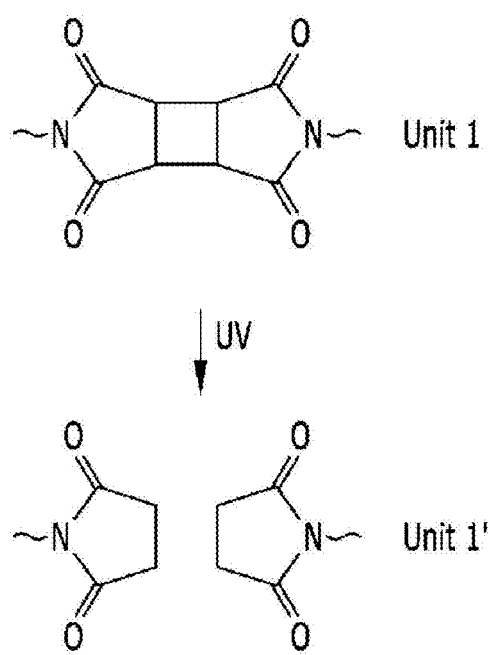
FIG. 3 is a formula showing polyimide decomposition in an alignment layer according to an exemplary embodiment of the present invention.
Figure 4:
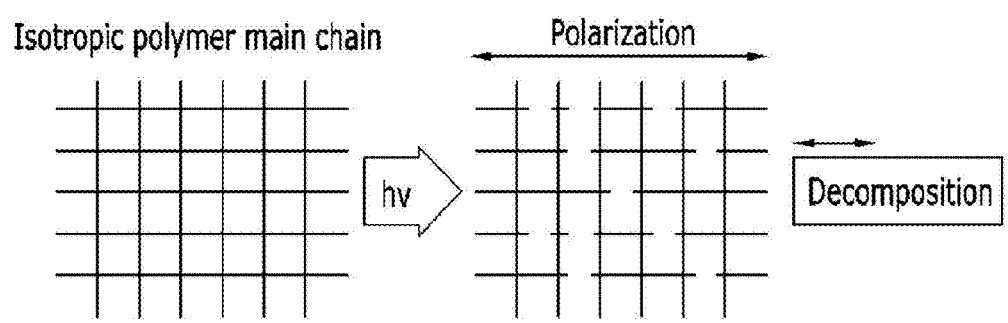
FIG. 4 is a view showing a process of changing from isotropic to anisotropic in an alignment layer according to an exemplary embodiment of the present invention.

FIG. 3 is a formula showing polyimide decomposition in an alignment layer, according to an exemplary embodiment of the present invention. FIG. 4 is a view showing a process of changing from an isotropic to an anisotropic alignment layer according to an exemplary embodiment of the present invention.

Referring to FIG. 3, cyclobutane dianhydride (CBDA) and a diamine are subjected to a polymerization reaction through a baking process to form the polyimide (unit 1), and UV rays are radiated on the polyimide to form a maleimide (unit 1').

FIG. 4 illustrates a polymer main chain including the polyimide (unit 1) illustrated in FIG. 3 that is decomposed to be aligned according to radiation of polarized UV rays. Referring to FIG. 4, if polarized UV light is radiated on an isotropic polymer main chain, photodecomposition occurs in a polarization direction (absorption axis direction). Thus, a photo-alignment layer may be aligned in a direction that is perpendicular to the polarization direction. Herein, if an exposure amount is excessively small, since decomposition efficiency is low, the alignment property may deteriorate. On the contrary, if the exposure amount is excessively high, since decomposition efficiency is increased, decomposition occurs in another direction in addition to the polarization direction, and thus, the alignment property may deteriorate.

Referring to FIG. 1 and FIG. 2, the upper panel 200 will be described. A light blocking member 220 is formed on a second substrate 210 made of transparent glass or plastic. The light blocking member 220 is referred to as a black matrix and prevents light leakage.

A plurality of color filters 230 are formed on the second substrate 210. When the second passivation layer 180b of the lower panel 100 is the color filter, or the color filter is formed in the lower panel 100, the color filter 230 of the upper panel 200 may be omitted. Further, the light blocking member 220 of the upper display panel 200 may also be formed in the lower display panel 100.

An overcoat 250 is formed on the color filter 230 and the light blocking member 220. The overcoat 250 is made of an (organic) insulator, prevents exposure of the color filter 230, and provides a flat surface. The overcoat 250 may be omitted.

A second alignment layer 21 may be disposed on the overcoat 250. The second alignment layer 21 includes a photo-reactive material. The second alignment layer 21 may be formed with the same material and method as the described first alignment layer 11.

In the present exemplary embodiment, the liquid crystal layer 3 may include liquid crystal having negative dielectric anisotropy. In detail, the liquid crystal may be a composition including one or more compounds selected from the following Group A (a Group A composition hereinafter). Group A includes a first compound, a second compound, a third compound, a fourth compound, a fifth compound, a sixth compound, a seventh compound, an eighth compound, a ninth compound, a tenth compound, an eleventh compound, and a twelfth compound, respectively represented by Formula 1, Formula 2, Formula 3, Formula 4, Formula 5, Formula 6, Formula 7, Formula 8, Formula 9, Formula 10, Formula 11, and Formula 12.

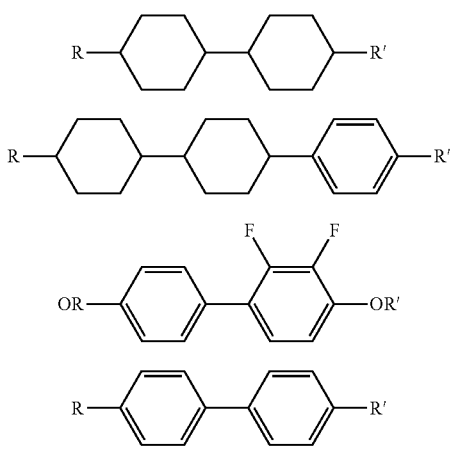

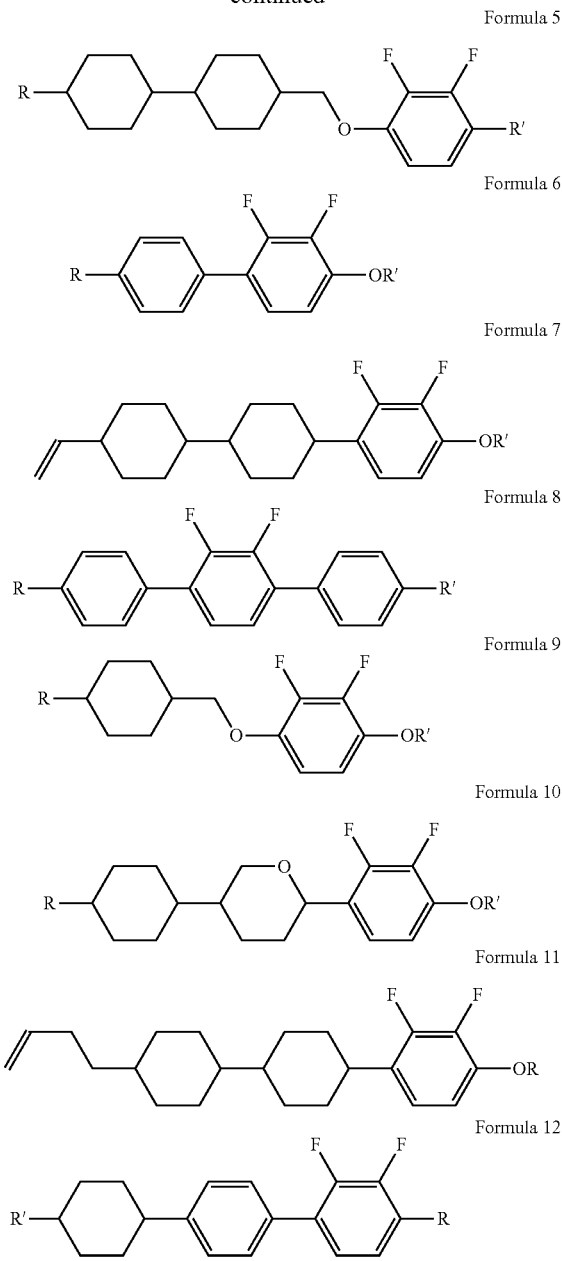

Here, R and R' are independently an alkenyl group, an alkyl group, or an alkoxy group including a double bond.

According to an exemplary embodiment, provided is a Group A composition that includes the first compound, the third compound, the fourth compound, the fifth compound, the sixth compound, the seventh compound, and the eighth compound. When an entire content of the liquid crystal is 100 wt %, a sum of the first compound, the third compound, the fourth compound, the fifth compound, the sixth compound, the seventh compound, and the eighth compound may be 100 wt %.

In the present exemplary embodiment, the content of the first compound may be about 37 wt %, the content of the third compound may be about 4 wt %, the content of the fourth compound may be about 7 wt %, the content of the fifth compound may be about 28 wt %, the content of the sixth compound may be about 6 wt %, the content of the seventh compound may be about 13 wt %, and the content of the eighth compound may be about 5 wt %. As another exemplary embodiment, the content of the first compound may be about 34 wt %, the content of the third compound may be about 4 wt %, the content of the fourth compound may be about 9 wt %, the content of the fifth compound may be about 30 wt %, the content of the sixth compound may be about 6 wt %, the content of the seventh compound may be about 13 wt %, and the content of the eighth compound may be about 4 wt %.

According to an exemplary embodiment of the present invention, provided is a Group A composition that includes the first compound, the second compound, the fifth compound, the seventh compound, the eighth compound, the ninth compound, and the twelfth compound. When the entire content of the liquid crystal is 100 wt %, the sum of the first compound, the second compound, the fifth compound, the seventh compound, the eighth compound, the ninth compound, and the twelfth compound may be 100 wt %. In the present exemplary embodiment, the content of the first compound may be about 34 wt %, the content of the second compound may be about 7 wt %, the content of the fifth compound may be about 6 wt %, the content of the seventh compound may be about 23 wt %, the content of the eighth compound may be about 7 wt %, the content of the ninth compound may be about 13 wt %, and the content of the twelfth compound may be about 10 wt %.

According to an exemplary embodiment of the present invention, provided is a Group A composition that includes the first compound, the second compound, the third compound, the fifth compound, the eighth compound, the ninth compound, and the tenth compound. When the entire content of the liquid crystal is 100 wt %, the sum of the first compound, the second compound, the third compound, the fifth compound, the eighth compound, the ninth compound, and the tenth compound may be 100 wt %. In the present exemplary embodiment, the content of the first compound may be about 35 wt %, the content of the second compound may be about 11 wt %, the content of the third compound may be about 13 wt %, the content of the fifth compound may be about 15 wt %, the content of the eighth compound may be about 8 wt %, the content of the ninth compound may be about 8 wt %, and the content of the tenth compound may be about 10 wt %.

As another exemplary embodiment, the content of the first compound may be about 35 wt %, the content of the second compound may be about 9 wt %, the content of the third compound may be about 6 wt %, the content of the fifth compound may be about 23 wt %, the content of the eighth compound may be about 14 wt %, the content of the ninth compound may be about 11 wt %, and the content of the tenth compound may be about 3 wt %.

According to exemplary embodiment of the present invention, provided is a Group A composition that includes the first compound, the third compound, the fourth compound, the fifth compound, the eighth compound, the ninth compound, the tenth compound, and the twelfth compound. When the entire content of the liquid crystal is 100 wt %, the sum of the first compound, the second compound, the third compound, the fifth compound, the eighth compound, the ninth compound, and the tenth compound may be 100 wt %. In the present exemplary embodiment, the content of the first compound may be about 35 wt %, the content of the third compound may be about 9 wt %, the content of the fourth compound may be about 1 wt %, the content of the fifth compound may be about 23 wt %, the content of the eighth compound may be about 5 wt %, the content of the ninth compound may be about 13 wt %, the content of the tenth compound may be about 3 wt %, and the content of the twelfth compound may be about 11 wt %.

According to another exemplary embodiment of the present invention, the liquid crystal may be a composition including one or more compounds selected from the following Group B (a Group B composition hereinafter). Group B includes the first compound, the eighth compound, a thirteenth compound, a fourteenth compound, a fifteenth compound, a sixteenth compound, a seventeenth compound, an eighteenth compound, and a nineteenth compound respectively represented by Formula 1, Formula 8, Formula 13, Formula 14, Formula 15, Formula 16, Formula 17, Formula 18, and Formula 19.

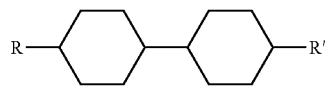

Formula 1

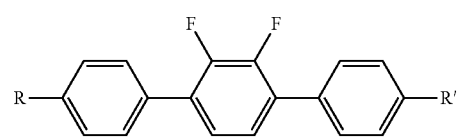

Formula 8

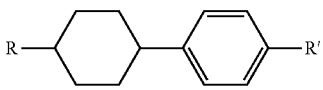

Formula 13

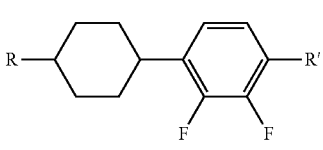

Formula 14

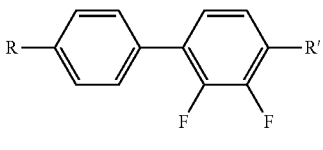

Formula 15

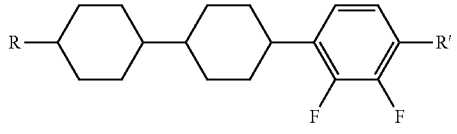

Formula 16

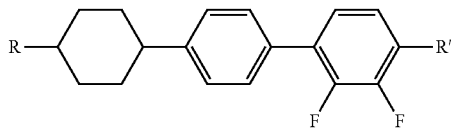

Formula 17

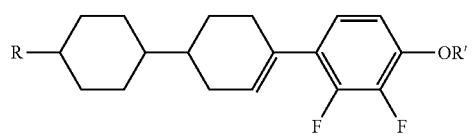

Formula 18

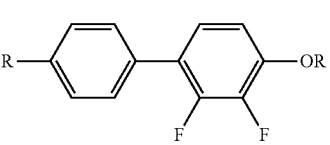

Formula 19

Here, R and R' are independently an alkenyl group, an alkyl group, or an alkoxy group including a double bond.

According to an exemplary embodiment of the present invention, provided is a Group B composition that includes the first compound, the eighth compound, the fourteenth compound, the fifteenth compound, the sixteenth compound, and the seventeenth compound. When the entire content of the liquid crystal is 100 wt %, the sum of the first compound, the eighth compound, the fourteenth compound, the fifteenth compound, the sixteenth compound, and the seventeenth compound may be 100 wt %. In the present exemplary embodiment, the content of the first compound may be about 35.5 wt %, the content of the eighth compound may be about 0.5 wt %, the content of the fourteenth compound may be about 13 wt %, the content of the fifteenth compound may be about 10 wt %, the content of the sixteenth compound may be about 23 wt %, and the content of the seventeenth compound may be about 18 wt %. As another exemplary embodiment, the content of the first compound may be about 34 wt %, the content of the eighth compound may be about 3 wt %, the content of the fourteenth compound may be about 15 wt %, the content of the fifteenth compound may be about 8 wt %, the content of the sixteenth compound may be about 22 wt %, and the content of the seventeenth compound may be about 18 wt %.

According to an exemplary embodiment of the present invention, provided is a Group B composition that includes the first compound, the eighth compound, the thirteenth compound, the fourteenth compound, the fifteenth compound, the sixteenth compound, and the seventeenth compound. When the entire content of the liquid crystal is 100 wt %, the sum of the first compound, the eighth compound, the thirteenth compound, the fourteenth compound, the fifteenth compound, the sixteenth compound, and the seventeenth compound may be 100 wt %. In the present exemplary embodiment, the content of the first compound may be about 26.5 wt %, the content of the eighth compound may be about 2.5 wt %, the content of the thirteenth compound may be 9 wt %, the content of the fourteenth compound may be about 10 wt %, the content of the fifteenth compound may be about 8 wt %, the content of the sixteenth compound may be about 26 wt %, and the content of the seventeenth compound may be about 18 wt %.

According to an exemplary embodiment of the present invention, provided is a Group B composition that includes the first compound, the eighth compound, the fifteenth compound, the sixteenth compound, the seventeenth compound, the eighteenth compound, and the nineteenth compound. When the entire content of the liquid crystal is 100 wt %, the sum of the first compound, the eighth compound, the fifteenth compound, the sixteenth compound, the seventeenth compound, the eighteenth compound, and the nineteenth compound may be 100 wt %. In the present exemplary embodiment, the content of the first compound may be about 38 wt %, the content of the eighth compound may be about 2 wt %, the content of the fifteenth compound may be about 12 wt %, the content of the sixteenth compound may be about 13 wt %, the content of the seventeenth compound may be about 18 wt %, the content of the eighteenth compound may be about 10 wt %, and the content of the nineteenth compound may be about 7 wt %.

As another exemplary embodiment, the content of the first compound may be about 33 wt %, the content of the eighth compound may be about 10.5 wt %, the content of the fifteenth compound may be about 15 wt %, the content of the sixteenth compound may be about 7 wt %, the content of the seventeenth compound may be about 18.5 wt %, the content of the eighteenth compound may be about 11 wt %, and the content of the nineteenth compound may be about 5 wt %.

As another exemplary embodiment, the content of the first compound may be about 34 wt %, the content of the eighth compound may be about 7 wt %, the content of the fifteenth compound may be about 15 wt %, the content of the sixteenth compound may be about 11.5 wt %, the content of the seventeenth compound may be about 20.5 wt %, the content of the eighteenth compound may be about 10 wt %, and the content of the nineteenth compound may be about 2 wt %.

As another exemplary embodiment, the content of the first compound may be about 34 wt %, the content of the eighth compound may be about 7 wt %, the content of the fifteenth compound may be about 15.5 wt %, the content of the sixteenth compound may be about 12 wt %, the content of the seventeenth compound may be about 19.5 wt %, the content of the eighteenth compound may be about 10 wt %, and the content of the nineteenth compound may be about 2 wt %.

As another exemplary embodiment, the content of the first compound may be about 33 wt %, the content of the eighth compound may be about 12 wt %, the content of the fifteenth compound may be about 10 wt %, the content of the sixteenth compound may be about 7.5 wt %, the content of the seventeenth compound may be about 20 wt %, the content of the eighteenth compound may be about 10 wt %, and the content of the nineteenth compound may be about 7.5 wt %.

According an exemplary embodiment of the present invention, provided is a Group B composition that includes the first compound, the fifteenth compound, the sixteenth compound, the seventeenth compound, the eighteenth compound, and the nineteenth compound. When the entire content of the liquid crystal is 100 wt %, the sum of the first compound, the fifteenth compound, the sixteenth compound, the seventeenth compound, the eighteenth compound, and the nineteenth compound may be 100 wt %. In the present exemplary embodiment, the content of the first compound may be about 37.5 wt %, the content of the fifteenth compound may be about 13.5 wt %, the content of the sixteenth compound may be about 17 wt %, the content of the seventeenth compound may be about 18 wt %, the content of the eighteenth compound may be about 10 wt %, and the content of the nineteenth compound may be about 4 wt %.

As another exemplary embodiment, the content of the first compound may be about 39 wt %, the content of the fifteenth compound may be about 12 wt %, the content of the sixteenth compound may be about 13 wt %, the content of the seventeenth compound may be about 20 wt %, the content of the eighteenth compound may be about 10 wt %, and the content of the nineteenth compound may be about 6 wt %.

As another exemplary embodiment, the content of the first compound may be about 38 wt %, the content of the fifteenth compound may be about 11.5 wt %, the content of the sixteenth compound may be about 16 wt %, the content of the seventeenth compound may be about 20 wt %, the content of the eighteenth compound may be about 10 wt %, and the content of the nineteenth compound may be about 4.5 wt %.

The liquid crystal of the liquid crystal layer 3 may be arranged such that a long axis direction thereof may be perpendicular or parallel to the display panels 100 and 200. The pixel electrode 191 is applied with the data voltage from the drain electrode 175, and the common electrode 270 is applied with the common voltage of a predetermined level from a common voltage application unit disposed outside the display area.

The pixel electrode 191 and the common electrode 270 operate as field generating electrodes to generate an electrical field, such that the liquid crystal molecules of the liquid crystal layer 3 disposed thereon are rotated in a direction parallel to the direction of the electric field. As described above, according to the determined rotation direction of the liquid crystal molecules, the polarization of light passing through the liquid crystal layer is changed.

As described above, by forming the two field generating electrodes 191 and 270 on one display panel 100, transmittance of the liquid crystal display is increased and a wide viewing angle may be realized.

The common electrode 270 has the planar shape and the pixel electrode 191 has a plurality of branch electrodes, according to the exemplary embodiment shown in FIGS. 1 and 2. However, in a liquid crystal display according to another exemplary embodiment of the present invention, the pixel electrode 191 may have a planar shape and the common electrode 270 may have a plurality of branch electrodes.

The present invention is applied to all cases in which two field generating electrodes overlap via an insulating layer on the first substrate 110, the first field generating electrode under the insulating layer has the plane shape, and the second field generating electrode on the insulating layer has a plurality of branch electrodes.

Figure 5:
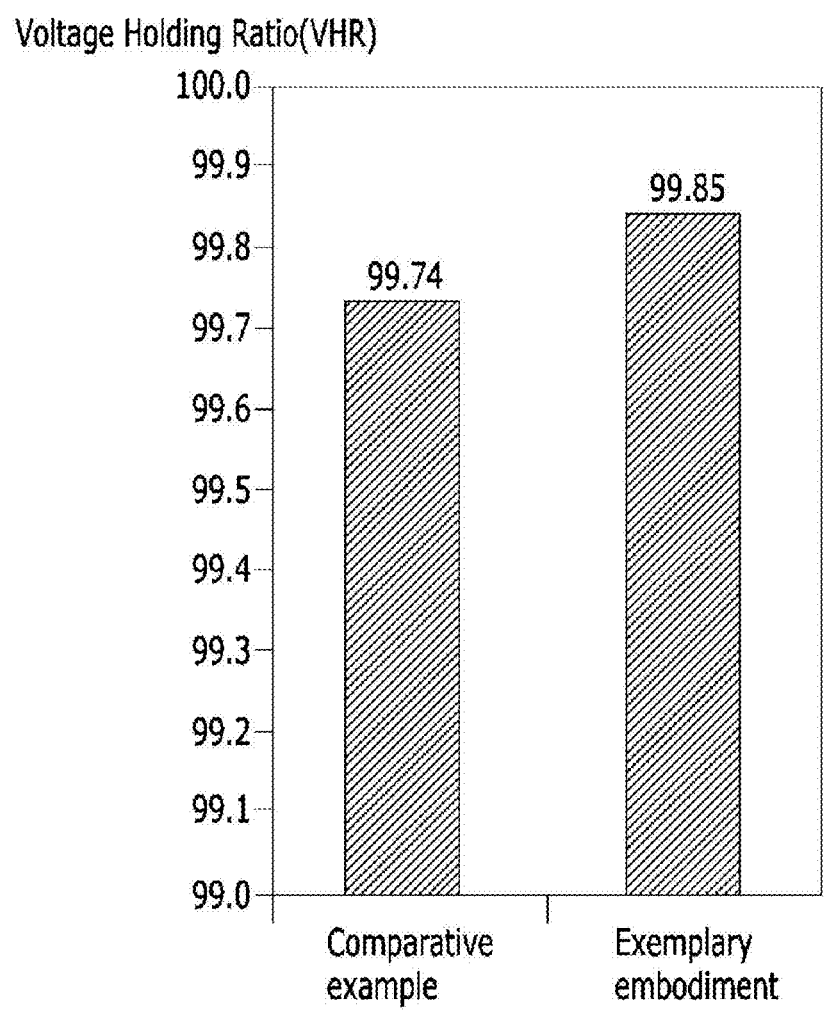
Figure 6:
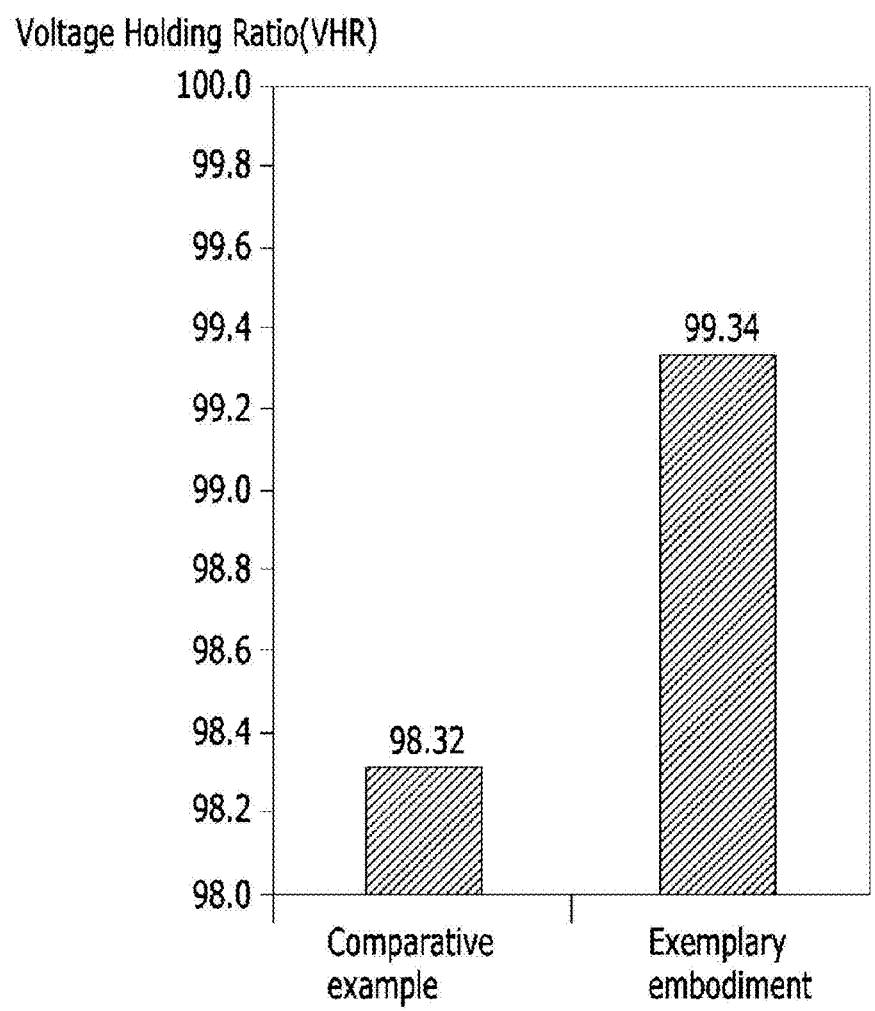

FIG. 5 to FIG. 7 are graphs comparing an afterimage level of a liquid crystal display according to an exemplary embodiment of the present invention with a afterimage level of a liquid crystal display according to a comparative example. In FIG. 5 to FIG. 7, the liquid crystal display according to the comparative example is similar to the liquid crystal display according to the exemplary embodiment, except that the alignment layer is formed by a conventional rubbing method instead of the photo-alignment layer.

FIG. 5 shows a voltage holding ratio (VHR) measured at 60 Hz, and FIG. 6 shows a voltage holding ratio (VHR) measured at 1 Hz. Referring to FIG. 5, the voltage holding ratio is 99.74% in the comparative example and is 99.85% in the exemplary embodiment. Referring to FIG. 6, the voltage holding ratio is 98.32% in the comparative example, and is 99.34% in the exemplary embodiment. The liquid crystal display according to an exemplary embodiment of the present invention is driven with a PLS mode and includes the planar field generating electrode and the linear field generating electrode overlapping each other via the insulating layer interposed therebetween, and includes the photo-alignment layer as well as the liquid crystal having negative dielectric anisotropy. Compared with the comparative example of forming the alignment layer by the rubbing method, it may be confirmed that the voltage holding ratio is increased in an exemplary embodiment of the present invention. Further, ion impurities may be reduced.

FIG. 7 shows a line number of linear afterimage generation according to an exemplary embodiment of the present invention using a photo-alignment layer and the comparative example without the photo-alignment layer in the PLS mode using the liquid crystal having negative dielectric anisotropy. Referring to FIG. 7, in the case of the comparative example, the linear afterimage is generated in two sheets among five sheets after a passage of 2.5 hours, however in an exemplary embodiment of the present invention, the linear afterimage is not generated even when 6 hours have passed.

Figure 8A:
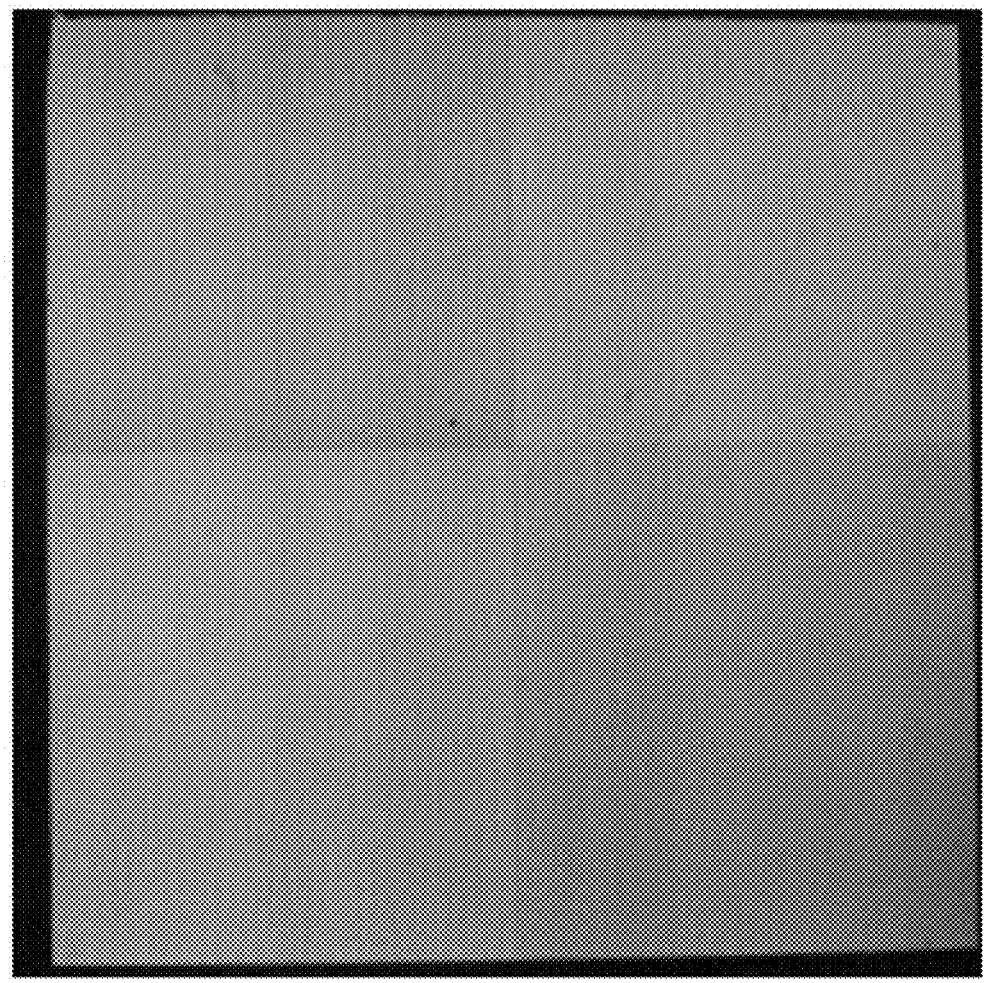
FIG. 8A is a photograph showing a linear afterimage of a liquid crystal display according to a comparative example.
Figure 8B:
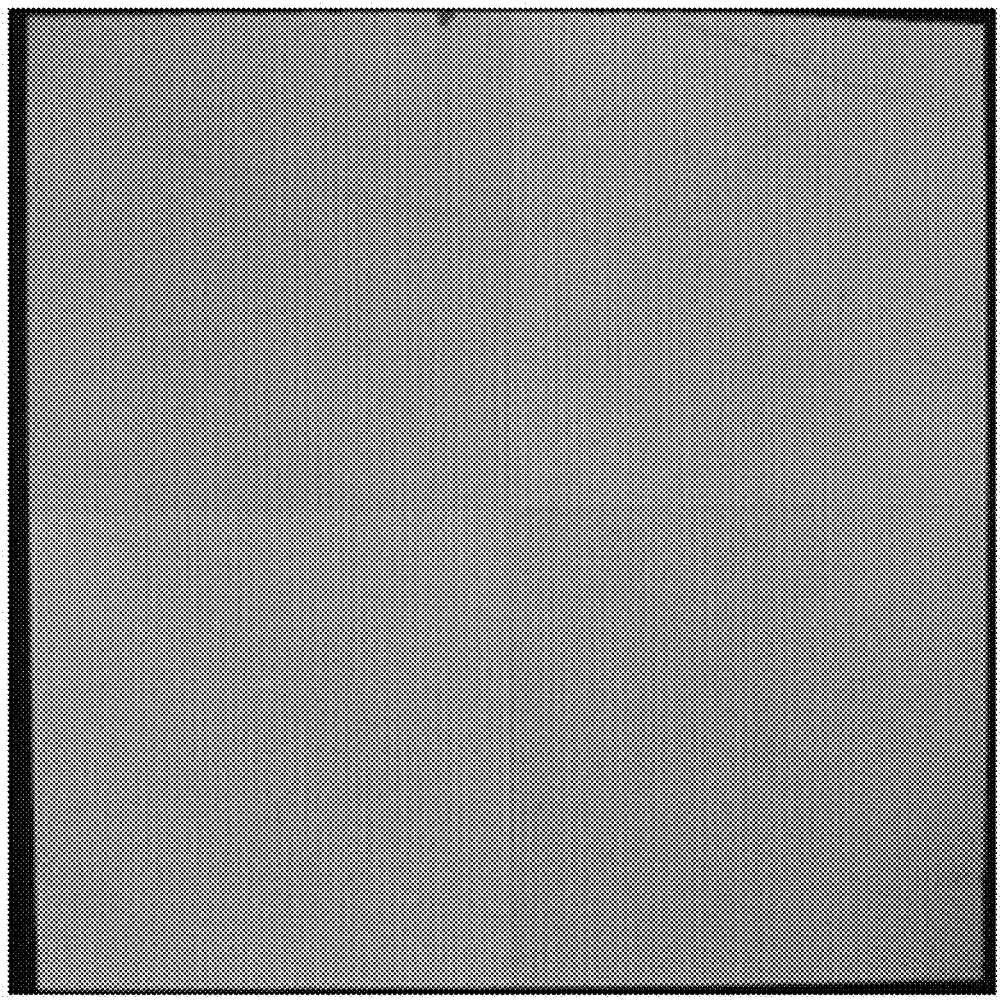
FIG. 8B is a photograph showing a linear afterimage of a liquid crystal display according to an exemplary embodiment of the present invention.

FIG. 8A is a photograph of a linear afterimage of a liquid crystal display according to a comparative example, and FIG. 8B is a picture showing a linear afterimage of a liquid crystal display according to an exemplary embodiment of the present invention. Referring to FIG. 8A and FIG. 8B, as compared with the comparative example, it may be confirmed that the linear afterimage degree is low, according to an exemplary embodiment of the present invention, when evaluated by eye.

According to an exemplary embodiment of the present invention, by using the liquid crystal having negative dielectric anisotropy instead of the liquid crystal having positive dielectric anisotropy in the PLS mode, the transmittance may be improved, and by adding the photo-alignment layer technique, the linear afterimages that may be generated due to the negative dielectric anisotropy includes many ion impurities, may be reduced. The liquid crystal compositions taught in the present specification are combined with the photo-alignment layer technique described in the present specification for the afterimage improvement reduction.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A liquid crystal display comprising:

a first substrate;

a second substrate facing the first substrate;

a liquid crystal layer having a negative dielectric anisotropy and disposed between the first substrate and the second substrate;

a thin film transistor disposed on the first substrate;

a first electrode connected to the thin film transistor;

a second electrode overlapping the first electrode;

an insulating layer disposed between the first and second electrodes; and a first alignment layer disposed on the first electrode and comprising a photo-alignment layer, wherein the photo-alignment layer is formed by polymerizing a diamine and at least one of a cyclobutane dianhydride (CBDA) represented by Formula (A) and a cyclobutane dianhydride (CBDA) derivative represented by Formula (B):

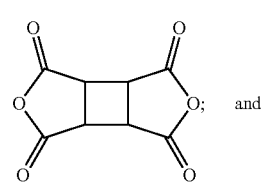

Formula (A)

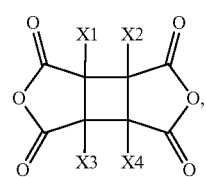

Formula (B)

wherein, in Formula (B), X1, X2, X3, and X4 are independently hydrogen, fluorine, or an organic compound, and at least one of X1, X2, X3, and X4 is not hydrogen, and wherein the first alignment layer comprises at least one repeating unit represented by Formula (C), Formula (D), and a Formula (E):

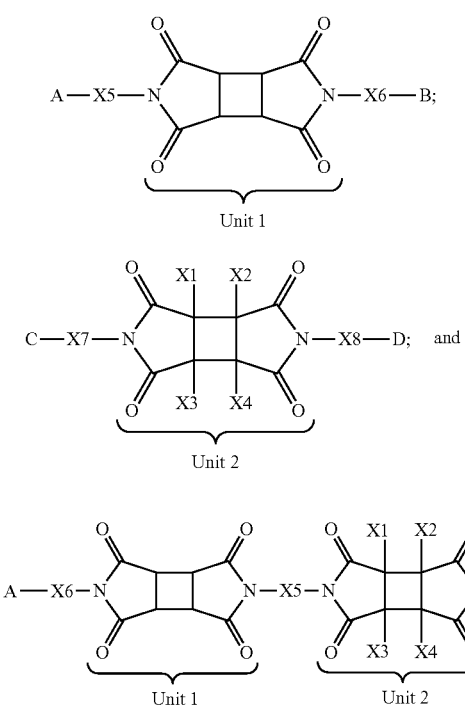

wherein, in Formula (C), Formula (D), and Formula (E), X5, X6, X7, and X8 are compounds coupled to two amino groups (—NH2) of adjacent diamines, A, B, C, D, E, and F are unit 1 or unit 2, and wherein in Formula (D) and Formula (E), X1, X2, X3, and X4 are independently hydrogen, fluorine, or an organic compound, and at least one of X1, X2, X3, and X4 is not hydrogen.

2. The liquid crystal display of claim 1, wherein the first electrode comprises branch electrodes, and the second electrode has a planar shape.

3. The liquid crystal display of claim 2, wherein the branch electrodes overlap the second electrode.

4. The liquid crystal display of claim 3, further comprising a passivation layer disposed between the thin film transistor and the second electrode, wherein the thin film transistor and the first electrode are connected by a contact hole extending through the passivation layer and the insulating layer.

5. The liquid crystal display of claim 1, wherein the liquid crystal layer comprises at least one compound selected from compounds represented by Formula 1, Formula 2, Formula 3, Formula 4, Formula 5, Formula 6, Formula 7, Formula 8, Formula 9, Formula 10, Formula 11, and Formula 12:

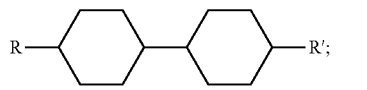

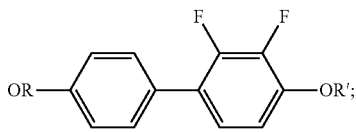

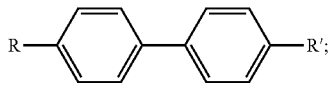

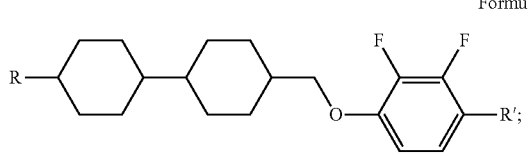

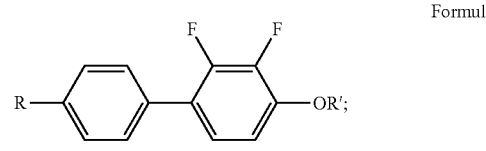

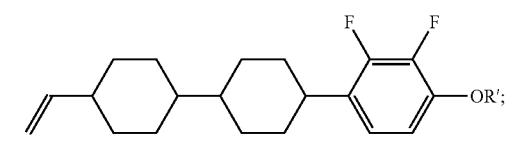

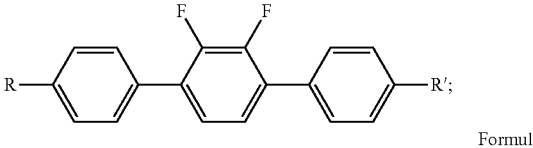

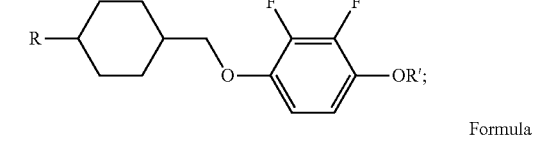

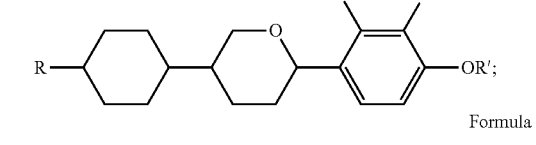

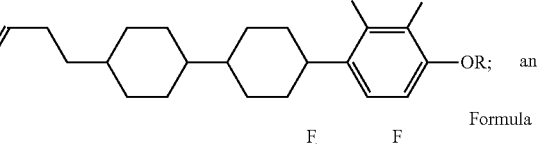

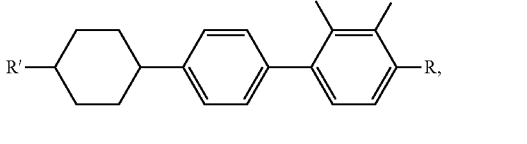

wherein R and R' are independently an alkenyl group, an alkyl group, or an alkoxy group.

6. The liquid crystal display of claim 5, wherein the liquid crystal layer comprises the compounds of Formulas 1, 3, 4, 5, 6, 7 and 8.

7. The liquid crystal display of claim 5, wherein the liquid crystal layer comprises the compounds of Formulas 1, 2, 5, 7, 8, 9, and 12.

8. The liquid crystal display of claim 5, wherein the liquid crystal layer comprises the compounds of Formulas 1, 2, 3, 5, 8, 9, and 10.

9. The liquid crystal display of claim 5, wherein the liquid crystal layer comprises the compounds of Formulas 1, 3, 4, 5, 8, 9, 10, and 12.

10. The liquid crystal display of claim 1, wherein the liquid crystal layer comprises at least one selected from the compounds represented by Formula 1, Formula 8, Formula 13, Formula 14, Formula 15, Formula 16, Formula 17, Formula 18, and Formula 19:

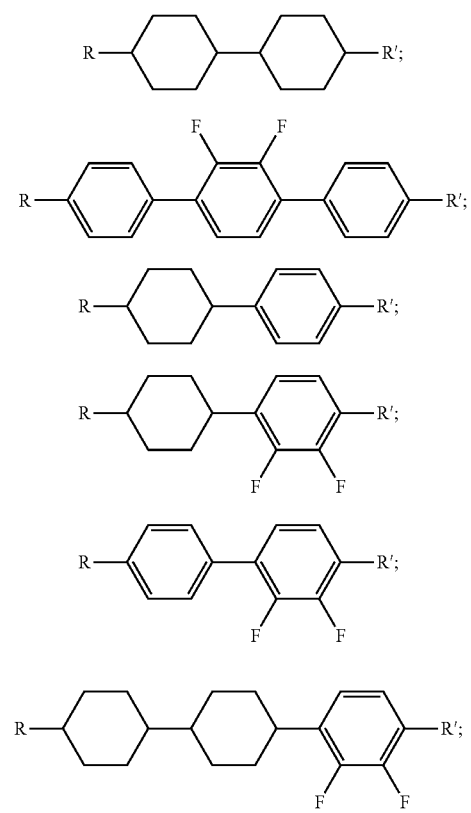

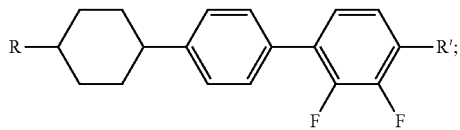

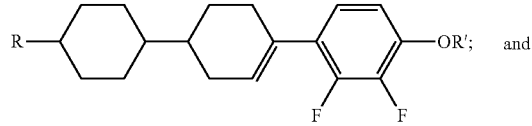

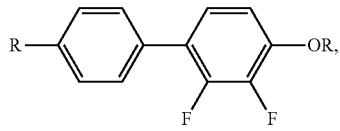

wherein R and R' are an alkenyl group, an alkyl group, or an alkoxy group, independently comprising a double bond.

11. The liquid crystal display of claim 10, wherein the liquid crystal layer comprises the compounds of Formulas 1, 8, 14, 15, 16, and 17.

12. The liquid crystal display of claim 10, wherein the liquid crystal layer comprises the compounds of Formulas 1, 8, 13, 14, 15, 16, and 17.

13. The liquid crystal display of claim 10, wherein the liquid crystal layer comprises the compounds of Formulas 1, 8, 15, 16, 17, 18, and 19.

14. The liquid crystal display of claim 10, wherein the liquid crystal layer comprises the compounds of Formulas 1, 15, 16, 17, 18, and 19.

15. The liquid crystal display of claim 1, wherein the first photo-alignment layer is formed by photo-decomposition.

16. The liquid crystal display of claim 1, further comprising a second alignment layer disposed on the second substrate, and the second alignment layer comprising a photo-alignment layer.

* * * * *